United States Patent
Hong

(10) Patent No.: US 11,599,131 B2
(45) Date of Patent: Mar. 7, 2023

(54) ELECTRONIC DEVICE PERFORMING POWER SWITCHING OPERATION

(71) Applicant: SK hynix Inc., Icheon-si Gyeonggi-do (KR)

(72) Inventor: Yun Seok Hong, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/499,570

(22) Filed: Oct. 12, 2021

(65) Prior Publication Data
US 2022/0404848 A1 Dec. 22, 2022

(30) Foreign Application Priority Data
Jun. 21, 2021 (KR) .................. 10-2021-0080446

(51) Int. Cl.
*G05F 1/56* (2006.01)
*H03K 17/687* (2006.01)

(52) U.S. Cl.
CPC ........... *G05F 1/56* (2013.01); *H03K 17/6872* (2013.01)

(58) Field of Classification Search
None
See application file for complete search history.

(56) References Cited

U.S. PATENT DOCUMENTS

| | | | |
|---|---|---|---|
| 6,424,585 B1 | 7/2002 | Ooishi | |
| 6,469,480 B2* | 10/2002 | Kanakubo | G05F 1/565 323/269 |
| 7,254,002 B2* | 8/2007 | Aemireddy | G05F 3/262 361/84 |
| 7,586,364 B2* | 9/2009 | Fujita | G05F 1/56 327/543 |
| 7,760,011 B2* | 7/2010 | Wang | G06F 30/30 326/31 |
| 8,129,861 B2* | 3/2012 | Kuhl | G05F 1/46 307/80 |
| 8,866,341 B2* | 10/2014 | Riederer | G05F 1/56 307/85 |
| 9,625,926 B1* | 4/2017 | Hoque | G05F 1/569 |
| 9,977,444 B1* | 5/2018 | Kong | G05F 1/563 |
| 10,684,671 B2* | 6/2020 | Sridhar | G06F 1/3296 |
| 11,079,785 B2* | 8/2021 | Hashiguchi | G05F 1/575 |
| 11,188,109 B1* | 11/2021 | Hong | G05F 1/66 |
| 11,294,412 B2* | 4/2022 | Sorace | G05F 1/461 |

(Continued)

FOREIGN PATENT DOCUMENTS

KR 1020120075985 A 7/2012

OTHER PUBLICATIONS

Wilson Amplifiers, Cell Phone Frequency Bands by Provider, Apr. 16, 2021, www.wilsonamplifiers.com/blog/frequencies-by-provider/ , accessed May 6, 2022 (Year: 2021).*

*Primary Examiner* — Thomas J. Hiltunen
(74) *Attorney, Agent, or Firm* — William Park & Associates Ltd.

(57) ABSTRACT

An electronic device includes an internal voltage driving circuit configured to drive an internal voltage to one of first and second power supply voltages based on a driving control signal depending on an operating frequency. The electronic device includes a driving control signal generation circuit configured to generate the driving control signal that sets a level of the internal voltage, by detecting the level of the internal voltage.

20 Claims, 7 Drawing Sheets

(56) References Cited

U.S. PATENT DOCUMENTS

2015/0349622 A1* 12/2015 Lo ........................... H02M 1/00
                                                                    323/282
2021/0232166 A1* 7/2021 Feng ....................... G05F 1/468

* cited by examiner

ELECTRONIC DEVICE PERFORMING POWER SWITCHING OPERATION

CROSS-REFERENCE TO RELATED APPLICATION

The present application claims priority under 35 U.S.C. § 119(a) to Korean application number 10-2021-0080446, filed in the Korean Intellectual Property Office on Jun. 21, 2021, the entire disclosure of which is incorporated herein by reference in its entirety.

BACKGROUND

1. Technical Field

The present disclosure relates to an electronic device which performs a power switching operation.

2. Related Art

A semiconductor device may switch power depending on an operating frequency by using a dynamic voltage frequency scaling (DVFS) technique.

When an operating frequency is high, the semiconductor device receives a power supply voltage with a high level so that an internal circuit may operate at a high speed, and when an operating frequency is low, the semiconductor device receives a power supply voltage with a low level so that power consumed in the internal circuit may be reduced.

SUMMARY

In an embodiment, an electronic device may include: an internal voltage driving circuit configured to drive an internal voltage to one of first and second power supply voltages based on a driving control signal depending on an operating frequency; and a driving control signal generation circuit configured to generate the driving control signal for setting a level of the internal voltage, by detecting the level of the internal voltage.

In an embodiment, an electronic device may include: a switching control signal generation circuit configured to output a driving control signal as one of first and second switching control signals depending on an operating frequency; and a power switching circuit configured to drive an internal voltage to one of first and second power supply voltages based on the first and second switching control signals, a level of the driving control signal being adjusted depending on a level of the internal voltage.

DETAILED DESCRIPTION

In the following descriptions of examples, the term "preset" indicates that the numerical value of a parameter is previously decided, when the parameter is used in a process or algorithm. According to an example, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal with "logic high level" is distinguished from a signal with "logic low level." For example, when a signal with a first voltage corresponds to a signal with a "logic high level," a signal with a second voltage may correspond to a signal with a "logic low level." According to an example, a "logic high level" may be set to a voltage higher than a "logic low level." According to an example, the logic levels of signals may be set to different logic levels or opposite logic levels. For example, a signal with a logic high level may be set to have a logic low level according to an example, and a signal with a logic low level may be set to have a logic high level according to an example.

Hereafter, the teachings of the present disclosure will be described in more detail through examples. These examples are only used to exemplify the teachings of the present disclosure, and the scope of the present disclosure is not limited by these examples.

Some examples of the present disclosure are directed to an electronic device which performs a power switching operation.

According to the present disclosure, by generating an internal voltage by switching power depending on an operating frequency, an internal circuit that is supplied with the internal voltage may efficiently consume power.

Also, according to the present disclosure, by generating a driving control signal by detecting a level of the internal voltage and performing, depending on the operating frequency based on the driving control signal, an operation of switching power and an operation of setting the level of the internal voltage to a target level, the level of the internal voltage may be stably set to the target level when switching power depending on the operating frequency.

Figure 1:
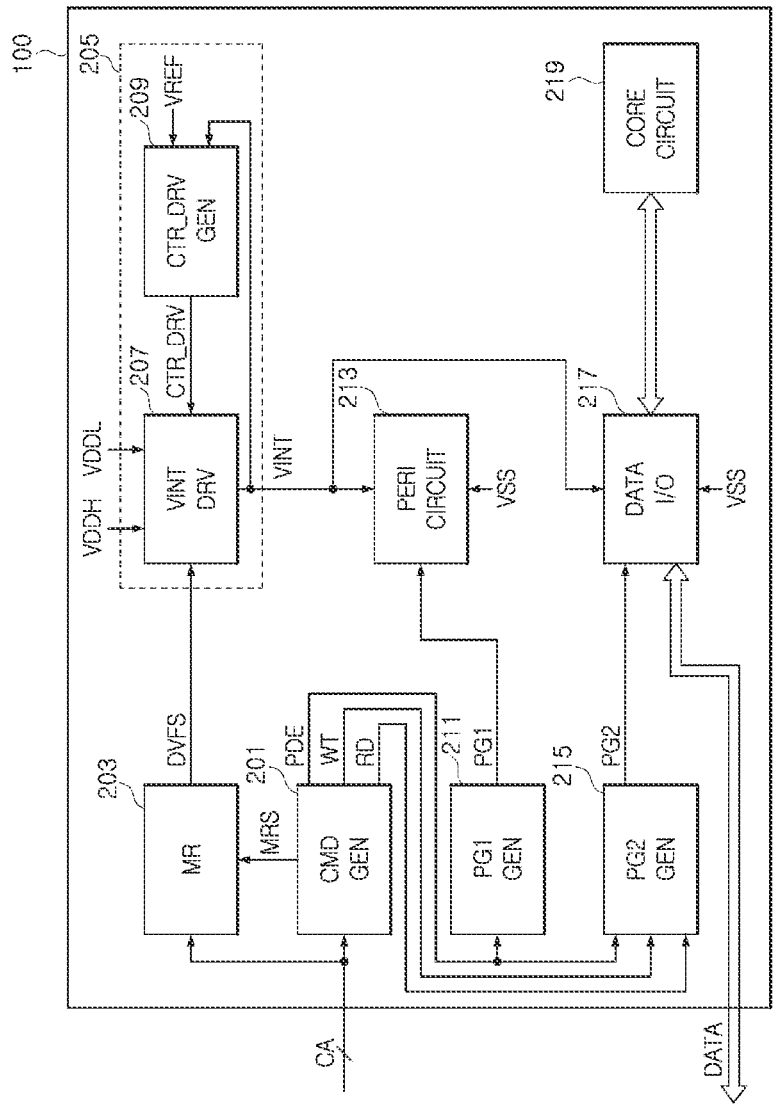
FIG. 1 is a block diagram illustrating a configuration of an electronic device in accordance with an example of the present disclosure.

FIG. 1 is a block diagram illustrating a configuration of an electronic device 100 in accordance with an example of the present disclosure. As illustrated in FIG. 1, the electronic device 100 may include a command generation circuit (CMD GEN) 201, a mode register (MR) 203, an internal voltage generation circuit 205, a first power gating signal generation circuit (PG1 GEN) 211, a peripheral circuit (PERI CIRCUIT) 213, a second power gating signal generation circuit (PG2 GEN) 215, a data input/output circuit (DATA I/O) 217 and a core circuit (CORE CIRCUIT) 219.

The electronic device 100 may be implemented with a memory device among the semiconductor devices. The electronic device 100 may receive a setting code CA from a controller (not illustrated). The electronic device 100 may transmit and receive data DATA to and from the controller. By receiving the setting code CA, the electronic device 100 may perform various internal operations, such as a write operation, a read operation, a power switching operation, and a power gating operation. The number of bits of each of the setting code CA and the data DATA may be variously set depending on the example.

The electronic device 100 may be applied with a first power supply voltage VDDH, a second power supply voltage VDDL, and a ground voltage VSS through power pads (not illustrated), respectively. The first power supply voltage VDDH may have a higher level than a level of the second power supply voltage VDDL. For example, the first power supply voltage VDDH and the second power supply voltage VDDL may be set to 1.05 V and 0.9 V, respectively.

The command generation circuit 201 may generate a mode register command MRS, a power-down command PDE, a write command WT, and a read command RD based on the setting code CA. The command generation circuit 201 may generate the mode register command MRS by decoding the setting code CA with a logic level combination for performing a mode register set operation. The command generation circuit 201 may generate the power-down command PDE by decoding the setting code CA with a logic level combination for performing a power-down mode. The command generation circuit 201 may generate the write command WT by decoding the setting code CA with a logic level combination for performing a write operation. The command generation circuit 201 may generate the read command RD by decoding the setting code CA with a logic level combination for performing a read operation.

The mode register 203 may receive the setting code CA based on the mode register command MRS, store the setting code CA as a mode signal DVFS, and output the stored mode signal DVFS. When the mode register set operation is performed, the mode register 203 may store the mode signal DVFS by receiving the setting code CA set as information with regard to the operating frequency. The operating frequency may indicate the frequency at which the electronic device 100 operates. The mode signal DVFS may be activated or deactivated depending on the operating frequency. For example, the mode signal DVFS may be deactivated when the operating frequency is set to a first frequency and may be activated when the operating frequency is set to a second frequency. In the present example, the first frequency may be set at a higher frequency than the second frequency.

The internal voltage generation circuit 205 may include an internal voltage driving circuit (VINT DRV) 207 and a driving control signal generation circuit (CTR_DRV GEN) 209. The internal voltage generation circuit 205 may generate an internal voltage VINT by being applied with the first power supply voltage VDDH and the second power supply voltage VDDL based on the mode signal DVFS. The internal voltage generation circuit 205 may generate the internal voltage VINT from one of the first power supply voltage VDDH and the second power supply voltage VDDL depending on the operating frequency based on the mode signal DVFS. For example, when the operating frequency is set to the first frequency, the internal voltage generation circuit 205 may generate the internal voltage VINT based on the first power supply voltage VDDH. Conversely, when the operating frequency is set to the second frequency, the internal voltage generation circuit 205 may generate the internal voltage VINT based on the second power supply voltage VDDL. Therefore, when the operating frequency is high, the internal voltage generation circuit 205 may generate the internal voltage VINT based on the first power supply voltage VDDH with a high level so that an internal circuit that is supplied with the internal voltage VINT may operate at high speed. When the operating frequency is low, the internal voltage generation circuit 205 may generate the internal voltage VINT based on the second power supply voltage VDDL with a low level so that power that is consumed in the internal circuit supplied with the internal voltage VINT may be reduced.

The internal voltage driving circuit 207 may drive the internal voltage VINT by being applied with the first power supply voltage VDDH and the second power supply voltage VDDL based on the mode signal DVFS and a driving control signal CTR_DRV. The driving control signal CTR_DRV may be generated to set the level of the internal voltage VINT to a target level. The target level may include a first target level and a second target level. The first target level may be set to a lower level than the level of the first power supply voltage VDDH. The second target level may be set to a lower level than the level of the second power supply voltage VDDL. In the present example, the first target level may be set to a higher level than the second target level. The level of the driving control signal CTR_DRV may be adjusted depending on the level of the internal voltage VINT.

The internal voltage driving circuit 207 may drive the internal voltage VINT to one of the first power supply voltage VDDH and the second power supply voltage VDDL based on the driving control signal CTR_DRV depending on the operating frequency. For example, when the operating frequency is set to the first frequency, the internal voltage driving circuit 207 may drive the internal voltage VINT to the first power supply voltage VDDH based on the driving control signal CTR_DRV. When the operating frequency is set to the second frequency, the internal voltage driving circuit 207 may drive the internal voltage VINT to the second power supply voltage VDDL based on the driving control signal CTR_DRV.

The internal voltage driving circuit 207 may set the level of the internal voltage VINT to the target level by linearly adjusting the level of the internal voltage VINT depending on the level of the driving control signal CTR_DRV based on the mode signal DVFS. When the operating frequency is set to the first frequency, the internal voltage driving circuit 207 may set the level of the internal voltage VINT to the first target level by linearly adjusting the level of the internal voltage VINT depending on the level of the driving control signal CTR_DRV. When the operating frequency is set to the second frequency, the internal voltage driving circuit 207 may set the level of the internal voltage VINT to the second target level by linearly adjusting the level of the internal voltage VINT depending on the level of the driving control signal CTR_DRV. Accordingly, by performing, depending on the operating frequency based on the driving control signal CTR_DRV, an operation of switching power and an operation of setting the level of the internal voltage VINT to the target level, the internal voltage driving circuit 207 may stably set the level of the internal voltage VINT to the target level when switching power depending on the operating frequency.

The driving control signal generation circuit 209 may generate the driving control signal CTR_DRV by detecting the level of the internal voltage VINT based on a reference voltage VREF. Depending on the example, the level of the reference voltage VREF may be variously set based on the operating frequency. The driving control signal generation circuit 209 may adjust the level of the driving control signal CTR_DRV so as to set the level of the internal voltage VINT to the target level, by comparing the level of the internal voltage VINT with the level of the reference voltage VREF. For example, when the operating frequency is set to the first frequency, the driving control signal generation circuit 209 may adjust the level of the driving control signal CTR_DRV so as to set the level of the internal voltage VINT to the first target level, based on the internal voltage VINT and the reference voltage VREF. When the operating frequency is set to the second frequency, based on the internal voltage VINT and the reference voltage VREF, the driving control signal generation circuit 209 may adjust the level of the driving control signal CTR_DRV so as to set the level of the internal voltage VINT to the second target level. The more detailed configuration and operation of the internal voltage generation circuit 205 will be described later with reference to FIG. 2.

The first power gating signal generation circuit 211 may generate a first power gating signal PG1 based on the power-down command PDE. Based on the power-down command PDE, the first power gating signal generation circuit 211 may deactivate the first power gating signal PG1 when the power-down mode is performed. Based on the power-down command PDE, the first power gating signal generation circuit 211 may activate the first power gating signal PG1 when the power-down mode is ended.

Based on the first power gating signal PG1, the peripheral circuit 213 may perform various internal operations by being supplied with the internal voltage VINT and the ground voltage VSS. When the first power gating signal PG1 is deactivated in the power-down mode, the peripheral circuit 213 may be blocked from being supplied with the ground voltage VSS. When the first power gating signal PG1 is activated, the peripheral circuit 213 may be supplied with the ground voltage VSS. A more detailed configuration and operation of the peripheral circuit 213 will be described later with reference to FIG. 5.

The second power gating signal generation circuit 215 may generate a second power gating signal PG2 based on the power-down command PDE, the write command WT, and the read command RD. Based on the power-down command PDE, the second power gating signal generation circuit 215 may deactivate the second power gating signal PG2 when the power-down mode is performed. Based on the power-down command PDE, the second power gating signal generation circuit 215 may activate the second power gating signal PG2 when the power-down mode is ended. The second power gating signal generation circuit 215 may deactivate the second power gating signal PG2 when both the write command WT for the write operation and the read command RD for the read operation are deactivated. The second power gating signal generation circuit 215 may activate the second power gating signal PG2 when one of the write command WT for the write operation and the read command RD for the read operation is activated.

Based on the second power gating signal PG2, the data input/output circuit 217 may input and output the data DATA by being supplied with the internal voltage VINT and the ground voltage VSS. When the second power gating signal PG2 is deactivated, the data input/output circuit 217 may be blocked from being supplied with the ground voltage VSS. When the second power gating signal PG2 is activated, the data input/output circuit 217 may be supplied with the ground voltage VSS. During the write operation, the data input/output circuit 217 may receive the data DATA from the controller (not illustrated) and transmit the data DATA to the core circuit 219. During the read operation, the data input/output circuit 217 may receive the data DATA from the core circuit 219 and transmit the data DATA to the controller. The more detailed configuration and operation of the data input/output circuit 217 will be described later with reference to FIG. 6.

The core circuit 219 may include a plurality of memory cells (not illustrated). During the write operation, the core circuit 219 may store the data DATA in the plurality of memory cells. During the read operation, the core circuit 219 may output the data DATA stored in the plurality of memory cells.

Figure 2:
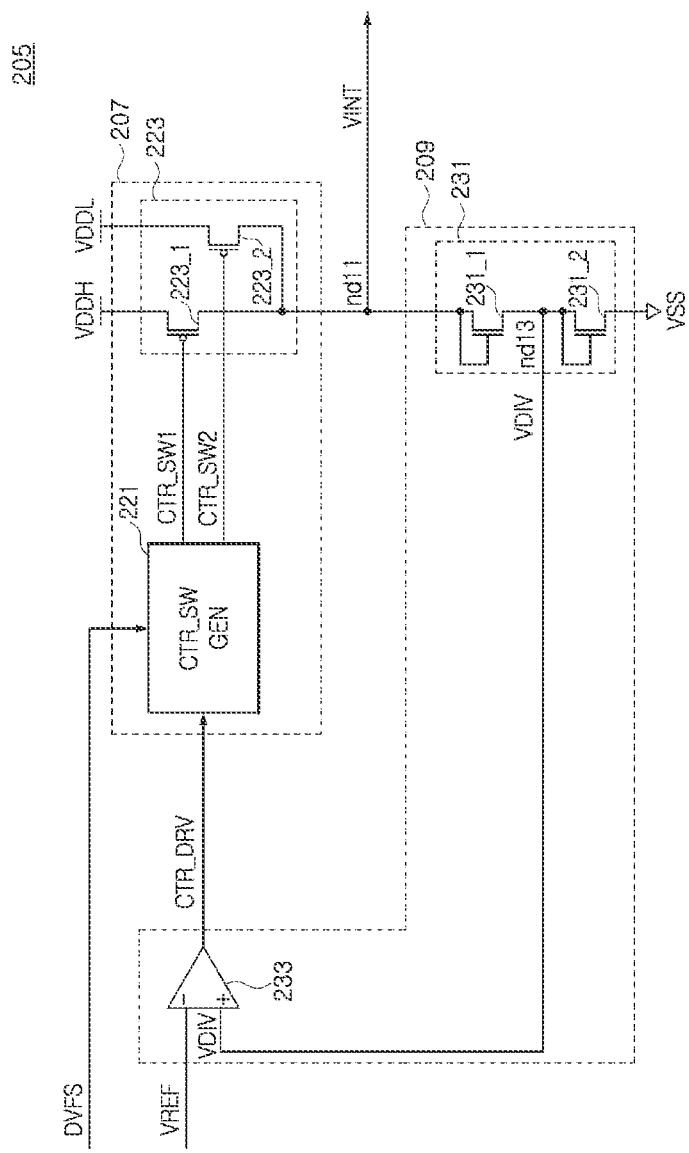
FIG. 2 is a diagram illustrating an example of an internal voltage generation circuit illustrated in FIG. 1.

FIG. 2 is a diagram illustrating an example of the internal voltage generation circuit 205 illustrated in FIG. 1. As illustrated in FIG. 2, the internal voltage generation circuit 205 may include the internal voltage driving circuit 207 and the driving control signal generation circuit 209.

The internal voltage driving circuit 207 may include a switching control signal generation circuit 221 and a power switching circuit 223. Based on the mode signal DVFS and the driving control signal CTR_DRV, the internal voltage driving circuit 207 may drive the internal voltage VINT by being applied with the first power supply voltage VDDH and the second power supply voltage VDDL.

The switching control signal generation circuit 221 may generate a first switching control signal CTR_SW1 and a second switching control signal CTR_SW2 based on the mode signal DVFS and the driving control signal CTR_DRV.

The switching control signal generation circuit 221 may output the driving control signal CTR_DRV as one of the first switching control signal CTR_SW1 and the second switching control signal CTR_SW2 depending on the operating frequency based on the mode signal DVFS. For example, when the operating frequency is set to the first frequency and thus the mode signal DVFS is deactivated, the switching control signal generation circuit 221 may output the driving control signal CTR_DRV as the first switching control signal CTR_SW1. When the operating frequency is set to the second frequency and thus the mode signal DVFS is activated, the switching control signal generation circuit 221 may output the driving control signal CTR_DRV as the second switching control signal CTR_SW2.

According to an example, the switching control signal generation circuit 221 may drive one of the first switching control signal CTR_SW1 and the second switching control signal CTR_SW2 to the first power supply voltage VDDH (see FIG. 3) depending on the operating frequency based on the mode signal DVFS. For example, when the operating frequency is set to the first frequency and thus the mode signal DVFS is deactivated, the switching control signal generation circuit 221 may drive the second switching control signal CTR_SW2 to the first power supply voltage VDDH (see FIG. 3). When the operating frequency is set to the second frequency and thus the mode signal DVFS is activated, the switching control signal generation circuit 221 may drive the first switching control signal CTR_SW1 to the first power supply voltage VDDH (see FIG. 3).

According to an example, the switching control signal generation circuit 221 may drive the first switching control signal CTR_SW1 to the first power supply voltage VDDH (see FIG. 4) or drive the second switching control signal CTR_SW2 to the second power supply voltage VDDL (see FIG. 4), depending on the operating frequency based on the mode signal DVFS. For example, when the operating frequency is set to the first frequency and thus the mode signal DVFS is deactivated, the switching control signal generation circuit 221 may drive the second switching control signal CTR_SW2 to the second power supply voltage VDDL (see FIG. 4). When the operating frequency is set to the second frequency and thus the mode signal DVFS is activated, the switching control signal generation circuit 221 may drive the first switching control signal CTR_SW1 to the first power supply voltage VDDH (see FIG. 4). The more detailed configuration and operation of the switching control signal generation circuit 221 will be described later with reference to FIGS. 3 and 4.

The power switching circuit 223 may include a first switching element 223_1 and a second switching element 223_2. The power switching circuit 223 may drive the internal voltage VINT to one of the first power supply voltage VDDH and the second power supply voltage VDDL based on the first switching control signal CTR_SW1 and the second switching control signal CTR_SW2. Each of the first switching element 223_1 and the second switching element 223_2 may be implemented with a PMOS transistor. The first switching element 223_1 may be coupled between a terminal of the first power supply voltage VDDH and an internal node nd11 through which the internal voltage VINT is driven. The second switching element 223_2 may be coupled between a terminal of the second power supply voltage VDDL and the internal node nd11 through which the internal voltage VINT is driven.

The power switching circuit 223 may turn off the first switching element 223_1 when the first switching control signal CTR_SW1 is driven to the first power supply voltage VDDH. When the operating frequency is set to the first frequency, the power switching circuit 223 may turn on the first switching element 223_1 based on the first switching control signal CTR_SW1 and thereby drive the internal voltage VINT to the first power supply voltage VDDH. When the operating frequency is set to the first frequency, the power switching circuit 223 may set the level of the internal voltage VINT to the first target level by linearly adjusting the level of the internal voltage VINT depending on the level of the first switching control signal CTR_SW1. For example, when the level of the internal voltage VINT is higher than the first target level, the power switching circuit 223 may set the level of the internal voltage VINT to the first target level by linearly decreasing the level of the internal voltage VINT based on the first switching control signal CTR_SW1. Conversely, when the level of the internal voltage VINT is lower than the first target level, the power switching circuit 223 may set the level of the internal voltage VINT to the first target level by linearly increasing the level of the internal voltage VINT based on the first switching control signal CTR_SW1.

The power switching circuit 223 may turn off the second switching element 223_2 when the second switching control signal CTR_SW2 is driven to the first power supply voltage VDDH or the second power supply voltage VDDL. When the operating frequency is set to the second frequency, the power switching circuit 223 may turn on the second switching element 223_2 based on the second switching control signal CTR_SW2 and thereby drive the internal voltage VINT to the second power supply voltage VDDL. When the operating frequency is set to the second frequency, the power switching circuit 223 may set the level of the internal voltage VINT to the second target level by linearly adjusting the level of the internal voltage VINT depending on the level of the second switching control signal CTR_SW2. For example, when the level of the internal voltage VINT is higher than the second target level, the power switching circuit 223 may set the level of the internal voltage VINT to the second target level by linearly decreasing the level of the internal voltage VINT based on the second switching control signal CTR_SW2. Conversely, when the level of the internal voltage VINT is lower than the second target level, the power switching circuit 223 may set the level of the internal voltage VINT to the second target level by linearly increasing the level of the internal voltage VINT based on the second switching control signal CTR_SW2.

The driving control signal generation circuit 209 may include a divided voltage generation circuit 231 and a comparison circuit 233. The driving control signal generation circuit 209 may generate the driving control signal CTR_DRV by detecting the level of the internal voltage VINT based on the reference voltage VREF.

The divided voltage generation circuit 231 may include a first resistor element 231_1 and a second resistor element 231_2. The resistance value of each of the first resistor element 231_1 and the second resistor element 231_2 may be variously set depending on the example. The divided voltage generation circuit 231 may generate a divided voltage VDIV by dividing the internal voltage VINT according to a ratio between resistance values of the first resistor element 231_1 and the second resistor element 231_2. The first resistor element 231_1 may be implemented with an NMOS transistor which is coupled between the internal node nd11 and an internal node nd13. The second resistor element 231_2 may be implemented with an NMOS transistor which is coupled between the internal node nd13 and a terminal of the ground voltage VSS.

The comparison circuit 233 may generate the driving control signal CTR_DRV by comparing the level of the divided voltage VDIV with the level of the reference voltage VREF. For example, the more the level of the divided voltage VDIV is lower than the level of the reference voltage VREF, the more the comparison circuit 233 may lower the level of the driving control signal CTR_DRV. The more the level of the divided voltage VDIV is higher than the level of the reference voltage VREF, the more the comparison circuit 233 may raise the level of the driving control signal CTR_DRV. The comparison circuit 233 may be implemented with a differential amplifier.

Figure 3:
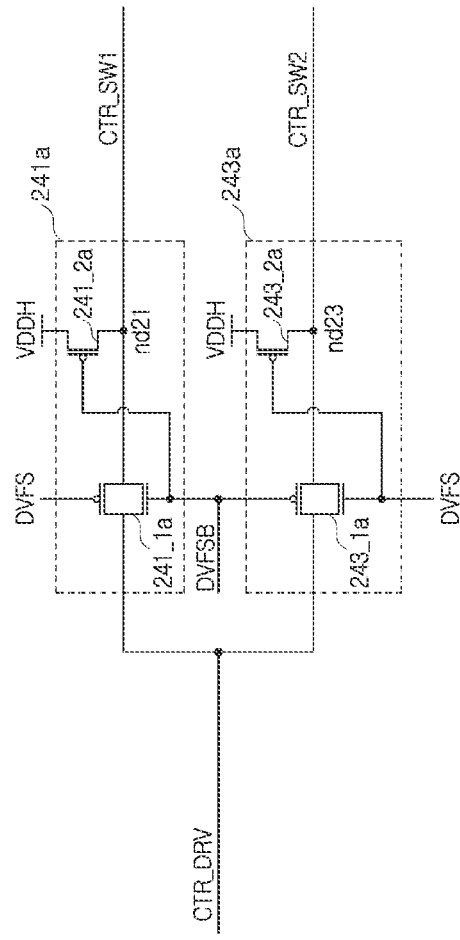
FIG. 3 is a circuit diagram illustrating an example of a switching control signal generation circuit illustrated in FIG. 2.

FIG. 3 is a circuit diagram illustrating an example of the switching control signal generation circuit 221 illustrated in FIG. 2. As illustrated in FIG. 3, the switching control signal generation circuit 221 may include a first switching control signal generation circuit 241*a* and a second switching control signal generation circuit 243*a*.

Based on the mode signal DVFS and an inverted mode signal DVFSB, the first switching control signal generation circuit 241*a* may generate the first switching control signal CTR_SW1 from the driving control signal CTR_DRV by being applied with the first power supply voltage VDDH. The inverted mode signal DVFSB may be generated by inverting and buffering the mode signal DVFS. When the operating frequency is set to the first frequency, the first switching control signal generation circuit 241*a* may output the driving control signal CTR_DRV as the first switching control signal CTR_SW1. When the operating frequency is set to the second frequency, the first switching control signal generation circuit 241a may drive the first switching control signal CTR_SW1 to the first power supply voltage VDDH. The first switching control signal generation circuit 241a may include a transfer gate 241_1a and a driving element 241_2a. When the mode signal DVFS is a logic low level and the inverted mode signal DVFSB is a logic high level, the transfer gate 241_1a may output the driving control signal CTR_DRV to an internal node nd21. The driving element 241_2a may drive the internal node nd21 to the first power supply voltage VDDH when the inverted mode signal DVFSB is a logic low level. The driving element 241_2a may be implemented with a PMOS transistor which is coupled between a terminal of the first power supply voltage VDDH and the internal node nd21.

Based on the mode signal DVFS and the inverted mode signal DVFSB, the second switching control signal generation circuit 243a may generate the second switching control signal CTR_SW2 from the driving control signal CTR_DRV by being applied with the first power supply voltage VDDH. When the operating frequency is set to the first frequency, the second switching control signal generation circuit 243a may drive the second switching control signal CTR_SW2 to the first power supply voltage VDDH. When the operating frequency is set to the second frequency, the second switching control signal generation circuit 243a may output the driving control signal CTR_DRV as the second switching control signal CTR_SW2. The second switching control signal generation circuit 243a may include a transfer gate 243_1a and a driving element 243_2a. When the mode signal DVFS is a logic high level and the inverted mode signal DVFSB is a logic low level, the transfer gate 243_1a may output the driving control signal CTR_DRV to an internal node nd23. The driving element 243_2a may drive the internal node nd23 to the first power supply voltage VDDH when the mode signal DVFS is a logic low level. The driving element 243_2a may be implemented with a PMOS transistor which is coupled between a terminal of the first power supply voltage VDDH and the internal node nd23.

Figure 4:
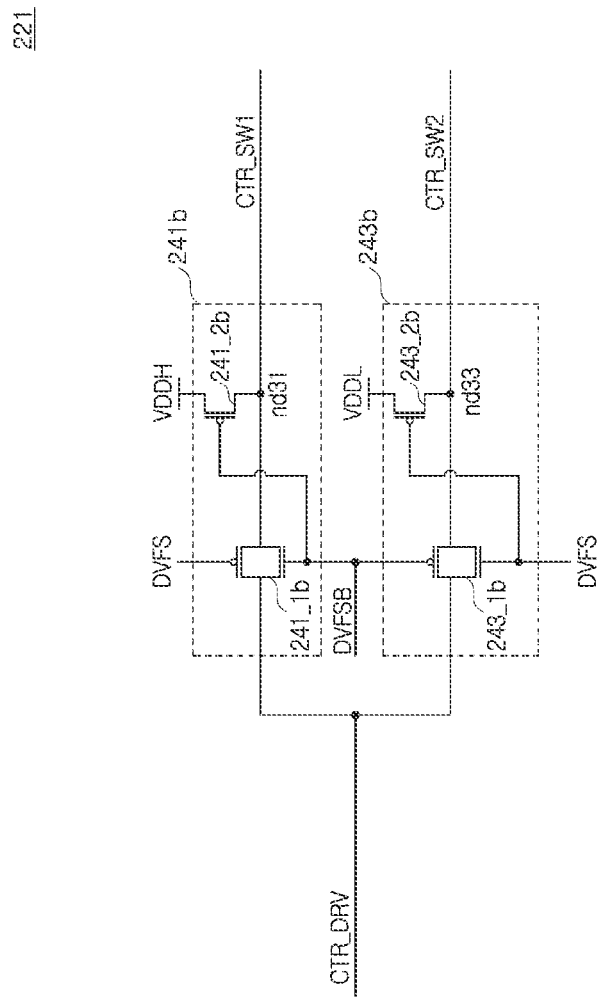
FIG. 4 is a circuit diagram illustrating another example of the switching control signal generation circuit illustrated in FIG. 2.

FIG. 4 is a circuit diagram illustrating another example of the switching control signal generation circuit 221 illustrated in FIG. 2. As illustrated in FIG. 4, the switching control signal generation circuit 221 may include a first switching control signal generation circuit 241b and a second switching control signal generation circuit 243b.

Based on the mode signal DVFS and an inverted mode signal DVFSB, the first switching control signal generation circuit 241b may generate the first switching control signal CTR_SW1 from the driving control signal CTR_DRV by being applied with the first power supply voltage VDDH. The first switching control signal generation circuit 241b may include a transfer gate 241_1b and a driving element 241_2b. Since the operation of the first switching control signal generation circuit 241b is implemented in the same manner as the operation of the first switching control signal generation circuit 241a illustrated in FIG. 3, detailed description thereof will be omitted herein.

Based on the mode signal DVFS and the inverted mode signal DVFSB, the second switching control signal generation circuit 243b may generate the second switching control signal CTR_SW2 from the driving control signal CTR_DRV by being applied with the second power supply voltage VDDL. When the operating frequency is set to the first frequency, the second switching control signal generation circuit 243b may drive the second switching control signal CTR_SW2 to the second power supply voltage VDDL. When the operating frequency is set to the second frequency, the second switching control signal generation circuit 243b may output the driving control signal CTR_DRV as the second switching control signal CTR_SW2. The second switching control signal generation circuit 243b may include a transfer gate 243_1b and a driving element 243_2b. When the mode signal DVFS is a logic high level and the inverted mode signal DVFSB is a logic low level, the transfer gate 243_1b may output the driving control signal CTR_DRV to an internal node nd33. The driving element 243_2b may drive the internal node nd33 to the second power supply voltage VDDL when the mode signal DVFS is a logic low level. The driving element 243_2b may be implemented with a PMOS transistor which is coupled between a terminal of the second power supply voltage VDDL and the internal node nd33.

Figure 5:
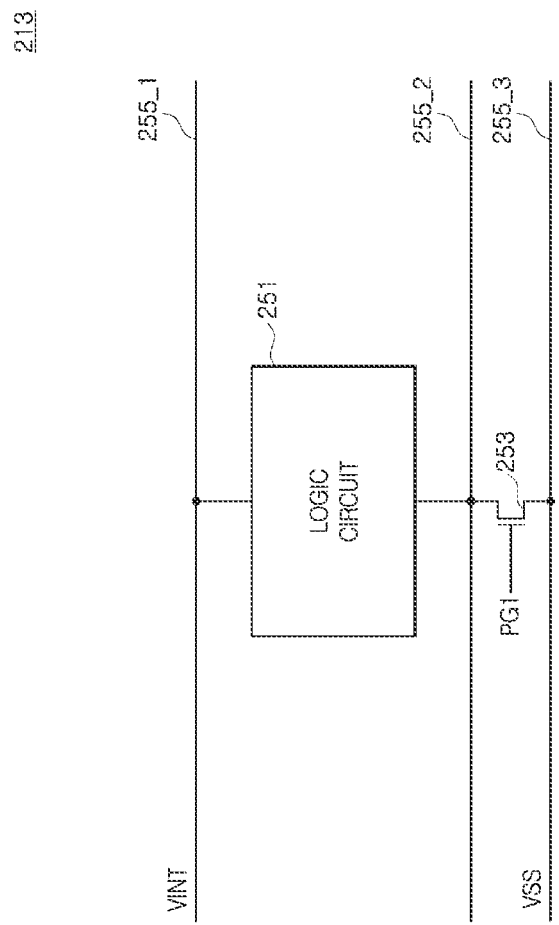
FIG. 5 is a diagram illustrating an example of a peripheral circuit illustrated in FIG. 1.

FIG. 5 is a diagram illustrating an example of the peripheral circuit 213 illustrated in FIG. 1. As illustrated in FIG. 5, the peripheral circuit 213 may include a logic circuit (LOGIC CIRCUIT) 251 and a ground switching element 253.

The logic circuit 251 may be coupled between a power line 255_1 and a virtual ground line 255_2. The power line 255_1 may supply the internal voltage VINT. The logic circuit 251 may be set as a circuit with a logic for performing various internal operations according to an embodiment.

The ground switching element 253 may be coupled between the virtual ground line 255_2 and a ground line 255_3. The ground line 255_3 may be coupled to a terminal of the ground voltage VSS. The ground switching element 253 may control the supply of the ground voltage VSS to the logic circuit 251 based on the first power gating signal PG1. The ground switching element 253 may block the supply of the ground voltage VSS to the logic circuit 251 when the first power gating signal PG1 is deactivated to a logic low level during the power-down mode. The ground switching element 253 may supply the ground voltage VSS to the logic circuit 251 when the first power gating signal PG1 is activated to a logic high level.

Figure 6:
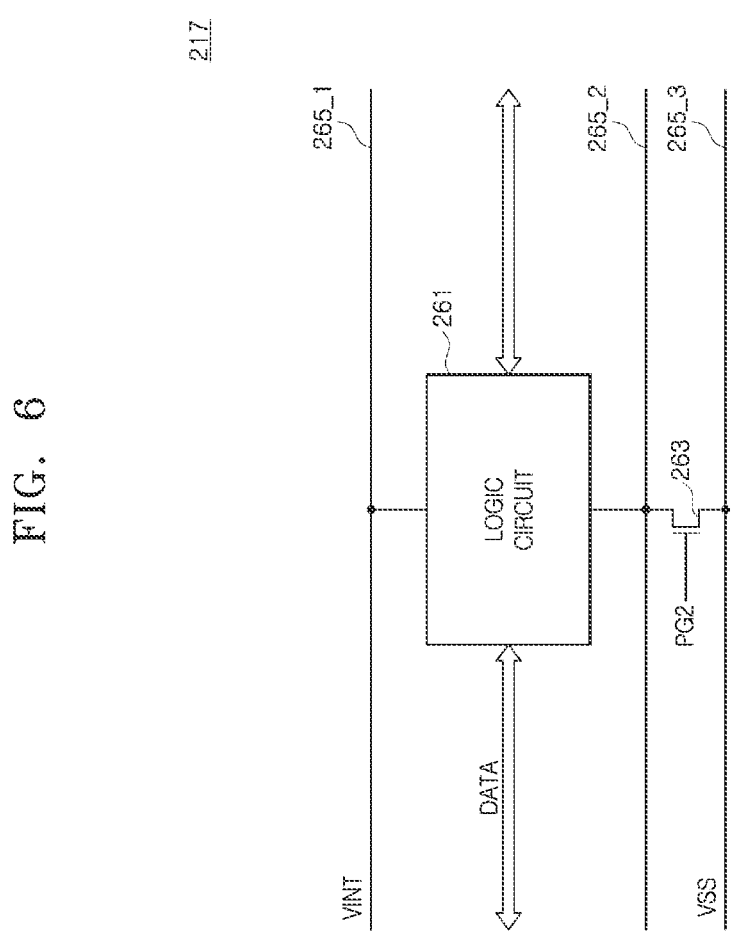
FIG. 6 is a diagram illustrating an example of a data input/output circuit illustrated in FIG. 1.

FIG. 6 is a diagram illustrating an example of the data input/output circuit 217 illustrated in FIG. 1. As illustrated in FIG. 6, the data input/output circuit 217 may include a logic circuit (LOGIC CIRCUIT) 261 and a ground switching element 263.

The logic circuit 261 may be coupled between a power line 265_1 and a virtual ground line 265_2. The power line 265_1 may supply the internal voltage VINT. The logic circuit 261 may be set as a circuit with a logic for inputting and outputting the data DATA.

The ground switching element 263 may be coupled between the virtual ground line 265_2 and a ground line 265_3. The ground line 265_3 may be coupled to a terminal of the ground voltage VSS. The ground switching element 263 may control the supply of the ground voltage VSS to the logic circuit 261 based on the second power gating signal PG2. The ground switching element 263 may block the supply of the ground voltage VSS to the logic circuit 261 when the second power gating signal PG2 is deactivated to a logic low level during the power-down mode. The ground switching element 263 may block the supply of the ground voltage VSS to the logic circuit 261 based on the second power gating signal PG2 which is deactivated when the write operation and the read operation are not performed. The ground switching element 263 may supply the ground voltage VSS to the logic circuit 261 based on the second power gating signal PG2 which is activated when the write operation and the read operation are performed.

As is apparent from the above description, according to the present disclosure, by generating an internal voltage by switching power depending on an operating frequency, power consumed in an internal circuit supplied with the internal voltage may be efficiently used. Also, according to the present disclosure, by generating a driving control signal by detecting the level of the internal voltage and performing, depending on the operating frequency based on the driving control signal, an operation of switching power and an operation of setting the level of the internal voltage to a target level, the level of the internal voltage may be stably set to the target level when switching power depending on the operating frequency.

Figure 7:
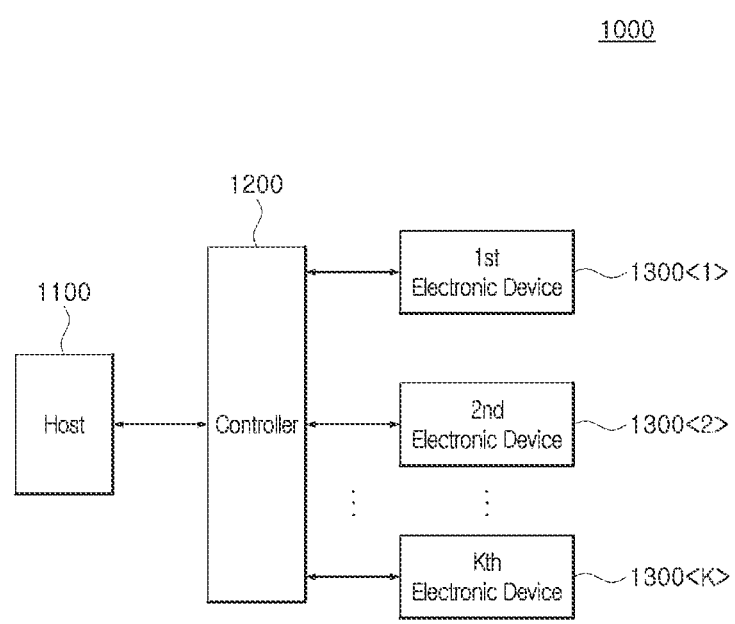
FIG. 7 is a block diagram illustrating a configuration of an electronic system in accordance with another example of the present disclosure.

FIG. 7 is a block diagram illustrating a configuration of an electronic system 1000 in accordance with another example of the present disclosure. As illustrated in FIG. 7, the electronic system 1000 may include a host 1100, a controller 1200 and electronic devices 1300<1:K>. Each of the electronic devices 1300<1:K> may be implemented with the electronic device 100, illustrated in FIG. 1.

The host 1100 and the controller 1200 may transmit signals to each other by using an interface protocol. Examples of the interface protocol used between the host 1100 and the controller 1200 include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI) and USB (universal serial bus).

The controller 1200 may control the electronic devices 1300<1:K>so that each of the electronic devices 1300<1:K>performs various internal operations including a write operation, a read operation, a power switching operation and a power gating operation.

According to an example, the electronic devices 1300<1:K>may be implemented with a DRAM (dynamic random access memory), a PRAM (phase change random access memory), an RRAM (resistive random access memory), an MRAM (magnetic random access memory) and an FRAM (ferroelectric random access memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An electronic device comprising:
   an internal voltage driving circuit configured to drive an internal voltage to one of first and second power supply voltages based on a driving control signal and a mode signal depending on an operating frequency; and
   a driving control signal generation circuit configured to generate the driving control signal that sets a level of the internal voltage by detecting the level of the internal voltage, wherein the mode signal is generated from setting code set as information with regard to the operating frequency when a mode register set operation is performed.

2. The electronic device according to claim 1, wherein the internal voltage driving circuit is configured to drive the internal voltage to the first power supply voltage when the operating frequency is set to a first frequency and configured to drive the internal voltage to the second power supply voltage when the operating frequency is set to a second frequency, the second frequency that is lower than the first frequency, and wherein a level of the second power supply voltage is lower than a level of the first power supply voltage.

3. The electronic device according to claim 1, wherein the internal voltage driving circuit is configured to drive the internal voltage to the first power supply voltage based on the driving control signal when the operating frequency is set to the first frequency, and
   wherein the level of the internal voltage is set to a first target level by being linearly adjusted depending on a level of the driving control signal.

4. The electronic device according to claim 3, wherein the internal voltage driving circuit is configured to drive the internal voltage to the second power supply voltage based on the driving control signal when the operating frequency is set to the second frequency, and
   wherein the level of the internal voltage is set to a second target level by being linearly adjusted depending on a level of the driving control signal.

5. The electronic device according to claim 1, wherein the driving control signal generation circuit is configured to adjust a level of the driving control signal by comparing the level of the internal voltage with a level of a reference voltage.

6. The electronic device according to claim 1, wherein the internal voltage driving circuit comprises:
   a switching control signal generation circuit configured to generate first and second switching control signals based on the driving control signal and the mode signal; and
   a power switching circuit configured to drive the internal voltage to the first power supply voltage based on the first switching control signal and configured to drive the internal voltage to the second power supply voltage based on the second switching control signal.

7. The electronic device according to claim 6, further comprising:
   a mode register configured to store the setting code as the mode signal.

8. The electronic device according to claim 6, wherein the switching control signal generation circuit is configured to output the driving control signal as one of the first and second switching control signals based on the mode signal.

9. The electronic device according to claim 8, wherein the switching control signal generation circuit is configured to output the driving control signal as the first switching control signal when the mode signal is deactivated, and
   wherein the second switching control signal is driven to the first power supply voltage.

10. The electronic device according to claim 8, wherein the switching control signal generation circuit is configured to output the driving control signal as the first switching control signal when the mode signal is deactivated, and
    wherein the second switching control signal is driven to the second power supply voltage.

11. The electronic device according to claim 8, wherein the switching control signal generation circuit is configured to output the driving control signal as the second switching control signal when the mode signal is activated, and
    wherein the first switching control signal is driven to the first power supply voltage.

12. The electronic device according to claim 1, further comprising:
    a logic circuit, coupled to a virtual ground line and a power line, the power line supplying the internal voltage; and
    a ground switching element, coupled to the virtual ground line and a ground line, the ground line supplying a ground voltage, configured to block supply of the ground voltage to the logic circuit when a power-down mode is performed.

13. An electronic device comprising:
a switching control signal generation circuit configured to output a driving control signal as one of first and second switching control signals depending on an operating frequency based on a mode signal; and
a power switching circuit configured to drive an internal voltage to one of first and second power supply voltages based on the first and second switching control signals, a level of the driving control signal being adjusted depending on a level of the internal voltage, wherein the mode signal is generated from setting code set as information with regard to the operating frequency when a mode register set operation is performed.

14. The electronic device according to claim 13, wherein the switching control signal generation circuit is configured to output the driving control signal as the first switching control signal when the operating frequency is set to a first frequency and is configured to output the driving control signal as the second switching control signal when the operating frequency is set to a second frequency, the second frequency being lower than the first frequency.

15. The electronic device according to claim 14, wherein the switching control signal generation circuit is configured to drive the second switching control signal to the first power supply voltage when the operating frequency is set to the first frequency and is configured to drive the first switching control signal to the first power supply voltage when the operating frequency is set to the second frequency.

16. The electronic device according to claim 14, wherein the switching control signal generation circuit is configured to drive the second switching control signal to the second power supply voltage when the operating frequency is set to the first frequency and is configured to drive the first switching control signal to the first power supply voltage when the operating frequency is set to the second frequency.

17. The electronic device according to claim 13, wherein the power switching circuit comprises:
a first switching element configured to drive the internal voltage to the first power supply voltage based on the first switching control signal; and
a second switching element configured to drive the internal voltage to the second power supply voltage based on the second switching control signal, a level of the second power supply voltage being lower than a level of the first power supply voltage.

18. The electronic device according to claim 17, wherein the power switching circuit is configured to linearly adjust a level of the internal voltage by turning on the first switching element based on the first switching control signal when the operating frequency is set to the first frequency and configured to linearly adjust a level of the internal voltage by turning on the second switching element based on the second switching control signal when the operating frequency is set to the second frequency.

19. The electronic device according to claim 17, wherein
the first switching element is implemented with a PMOS transistor that is coupled between a terminal of the first power supply voltage and an internal node through which the internal voltage is driven, and
the second switching element is implemented with a PMOS transistor coupled between a terminal of the second power supply voltage and the internal node.

20. The electronic device according to claim 13, further comprising:
a divided voltage generation circuit configured to generate a divided voltage by dividing the internal voltage; and
a comparison circuit configured to generate the driving control signal by comparing a level of the divided voltage with a level of a reference voltage.

* * * * *